(12) United States Patent
Yoo et al.

(10) Patent No.: US 9,263,448 B2
(45) Date of Patent: Feb. 16, 2016

(54) SEMICONDUCTOR DEVICE WITH BURIED METAL LAYER

(71) Applicant: SK hynix Inc., Icheon-si (KR)

(72) Inventors: Min Soo Yoo, Yongin-si (KR); Yun Ik Son, Seoul (KR)

(73) Assignee: SK HYNIX INC., Icheon (KR)

( * ) Notice: Subject to any disclaimer, the term of this patent is extended or adjusted under 35 U.S.C. 154(b) by 42 days.

(21) Appl. No.: 14/045,726

(22) Filed: Oct. 3, 2013

(65) Prior Publication Data

US 2014/0332896 A1 Nov. 13, 2014

(30) Foreign Application Priority Data

May 13, 2013 (KR) ........................ 10-2013-0053890

(51) Int. Cl.
*H01L 21/70* (2006.01)
*H01L 27/092* (2006.01)
*H01L 21/8238* (2006.01)

(52) U.S. Cl.
CPC .... *H01L 27/0924* (2013.01); *H01L 21/823821* (2013.01)

(58) Field of Classification Search
CPC .................................................. H01L 27/0924
USPC ........................................................ 257/369
See application file for complete search history.

(56) References Cited

U.S. PATENT DOCUMENTS

| | | | |
|---|---|---|---|
| 6,707,100 B2 | 3/2004 | Gajda | |
| 2006/0076603 A1* | 4/2006 | Matsuda | H01L 21/76838 257/301 |
| 2006/0177977 A1* | 8/2006 | Chan et al. | 438/238 |
| 2008/0277740 A1* | 11/2008 | Tateshita | 257/396 |
| 2008/0303101 A1* | 12/2008 | Kanarsky et al. | 257/374 |
| 2009/0152623 A1* | 6/2009 | Goto et al. | 257/329 |
| 2009/0289304 A1* | 11/2009 | Pouydebasque et al. | 257/351 |
| 2011/0163393 A1* | 7/2011 | Lander | 257/401 |
| 2012/0061750 A1 | 3/2012 | Chung | |

FOREIGN PATENT DOCUMENTS

KR 10-2011-0129643 A 12/2011
KR 10-1129745 B1 3/2012

* cited by examiner

*Primary Examiner* — Ajay K Arora

(57) ABSTRACT

A semiconductor device includes: a first active region defined by a recess contained in a device isolation film of a semiconductor substrate belonging to a first region and a second region, in a peripheral region including the first region, the second region, and a third region; a second active region defined by the device isolation film contained in the semiconductor substrate of the third region; a buried metal layer buried in the recess; a first conductive layer formed over the semiconductor substrate of the first region; and a second conductive layer formed over the semiconductor substrate of the second region, wherein the first conductive layer or the second conductive layer is formed over the semiconductor substrate of the third region. A three-dimensional dual gate is formed in a peripheral region, such that performance or throughput of transistors is maximized even in the peripheral region.

20 Claims, 4 Drawing Sheets

SEMICONDUCTOR DEVICE WITH BURIED METAL LAYER

CROSS-REFERENCE TO RELATED APPLICATION

The priority of Korean patent application No. 10-2013-0053890 filed on 13 May 2013, the disclosure of which is hereby incorporated in its entirety by reference, is claimed.

BACKGROUND

Embodiments relate to a semiconductor device and a method for forming the same, and more particularly to a three-dimensional (3D) n-type metal oxide semiconductor (NMOS) transistor and a three-dimensional (3D) p-type metal oxide semiconductor (PMOS) transistor which are included in a peripheral region.

As the integration degree of a semiconductor device increases, a design rule and a channel length are reduced, such that a buried-channel PMOS transistor requires a high voltage, resulting in deterioration of leakage current characteristics. In order to address the above-mentioned issue, a dual gate structure has been used such that the semiconductor device can be driven at a low voltage.

Meanwhile, in order to provide low cell contact resistance and refresh characteristics in response to reduction of a planar region occupied by electronic components configured to construct the semiconductor device, a three-dimensional structure such as a recess channel gate or a fin-shaped gate has been widely used. If a dual gate scheme comprised of NMOS and PMOS transistors is applied to a three-dimensional cell structure such as a recess channel gate and a fin-shaped gate, high-density doping may be needed.

However, provided that a gate stack is formed to have a higher height because an insulation interval and an active region are reduced in response to reduction of a design rule, it is difficult to define a gate line and gap-fill characteristics are deteriorated.

In addition, since the doping process is carried out by implanting ions into a polysilicon material, a gate stack has a limited height. Since the polysilicon material has a limited thickness of 1000 Å or less, gate depletion and ion penetration may occur, such that there is a need to strictly control ion implantation energy and dose.

Assuming that a PMOS transistor in a peripheral region has a three-dimensional structure such as a recess channel gate, the $P^+$ ion implantation method may not be appropriate to dope a polysilicon material in a high density because boron ions are distributed to an upper tungsten silicide layer or titanium silicide layer when subject to heat. As a result, the polysilicon material has difficulty in maintaining a high density and boron ions permeate into a channel of a silicon substrate, possibly reducing a threshold voltage. Thus, the above-mentioned semiconductor device may have difficulty in forming a 3D dual gate such as a recess channel gate or a fin-type gate in the peripheral region.

BRIEF SUMMARY

Various embodiments are directed to providing a semiconductor device and a method for forming the same that substantially improve one or more issues as mentioned above.

An embodiment relates to a semiconductor device and a method for fabricating the same, with a three-dimensional (3D) dual gate in the peripheral region.

In accordance with an aspect of and embodiment, a semiconductor device includes: a peripheral region in a semiconductor substrate, the peripheral region including a first region, a second region, and a third region; first active regions formed in a semiconductor substrate in the first region and the second region, the first active regions defined by recesses provided in device isolation films of the first region and the second region; a second active region defined by the device isolation film provided in the third region; a buried metal layer buried in one or more of the recesses; a first conductive layer formed over the first active region and the buried metal layer in the first region; and a second conductive layer formed over the first active region and the buried metal layer in the second region, wherein one of the first conductive layer and the second conductive layer is further formed over the second active region in the third region.

The first region includes a three-dimensional (3D) NMOS region.

The second region includes a three-dimensional (3D) PMOS region.

The third region includes a planar NMOS region or a planar NMOS region.

The first active regions include fin-type structures.

The second active region includes a planar structure.

The recesses are formed at both sides of the first active regions.

The buried metal layer includes a titanium nitride (TiN) film.

The buried metal layer has a thickness larger than about a half of the recess width.

The first conductive layer in the first region includes n-type polysilicon.

The second conductive layer includes p-type polysilicon.

The semiconductor device further comprises a first insulation film formed over an upper surface of the first active region and over a sidewall of the first active region exposed by the recess; a second insulation film formed over an upper surface of the second active region.

The semiconductor device further comprises a silicide film formed over the buried metal layer.

The semiconductor device further comprises a metal layer formed over (i) the first conductive layer, (ii) the second conductive layer, or (iii) both.

The metal layer includes tungsten (W).

In accordance with another aspect of embodiment, a method for forming a semiconductor device includes: providing in a semiconductor substrate, a peripheral region including a first region, a second region, and a third region; forming first active regions in the first region and the second region, the first active regions defined by recesses provided in device isolation films in the first region and the second region; forming a buried metal layer in one or more of the recesses; forming a first conductive layer over the first active region in the first region and the third region; and forming a second conductive layer over the first active region in the second region.

The formation of the recess may include: formation of the recesses includes: forming a first mask pattern over the device isolation films in the first region and the second region; and etching the device isolation films using the first mask pattern as an etch mask so as to expose both sides of the first active regions.

The method further include: forming the second active region in the third region when the first active regions are formed.

The method include: after the formation of the first active region, forming an insulation film over the first active region and the second active region.

The forming the buried metal layer includes: forming a metal layer in one or more of the recesses; and etching back the metal layer to expose the first active regions.

The metal includes a titanium nitride (TiN) film.

The method include: after the formation of the buried metal layer, forming a silicide film over the buried metal layer.

The forming the first conductive layer includes: forming a polysilicon film doped with n-type impurities.

The forming the second conductive layer includes: forming a second mask pattern to open the second region; and performing counter-doping of p-type impurities into the second region using the second mask pattern as a mask.

The method further includes: forming a third conductive layer having the same polarity as the second conductive layer is formed over a second active region in the third region, forming a third mask pattern to open the first active region in the second region and the second active region in the third region; and performing counter-doping of p-type impurities into the second region and the third region using the third mask pattern as a mask.

The method further includes: after the formation of the second conductive layer, forming a metal layer over the first conductive layer and the second conductive layer.

The metal layer includes tungsten (W).

In accordance with an aspect of and embodiment, a semiconductor device includes: a peripheral region including a first region, a second region, and a third region; a first three-dimensional active region provided in the first region; a second two-dimensional active region provided in the second region; a first gate provided over and coupled to the first three-dimensional active region; and a buried metal layer provided over a sidewall of the first three-dimensional active region and coupled to the first gate, wherein the buried metal layer has a first work function, and the first gate has a second work function different from the first work function.

The first three-dimensional active region includes first polarity active region and a second polarity active region, wherein the second polarity is different from the first polarity, and wherein the first work function is higher than the second work function in the first polarity active region, and the first work function is lower than the second work function in the second polarity active region.

The first gate in the first polarity active region forms of a fin-type NMOS transistor, wherein the first gate in the second polarity active region forms of a fin-type PMOS transistor, and wherein a gate in the second two-dimensional active region forms of one of a planar NMOS transistor and a planar PMOS transistor.

It is to be understood that both the foregoing description and the following detailed description of certain embodiments are exemplary and explanatory, and are not intended to be limiting.

DESCRIPTION OF EMBODIMENTS

Reference will now be made in detail to the embodiments, examples of which are illustrated in the accompanying drawings. The same reference numbers will be used throughout the drawings to refer to the same or like parts.

A semiconductor device and a method for fabricating the same according to the embodiments will hereinafter be described with reference to FIGS. 1 to 2f.

Figure 1:
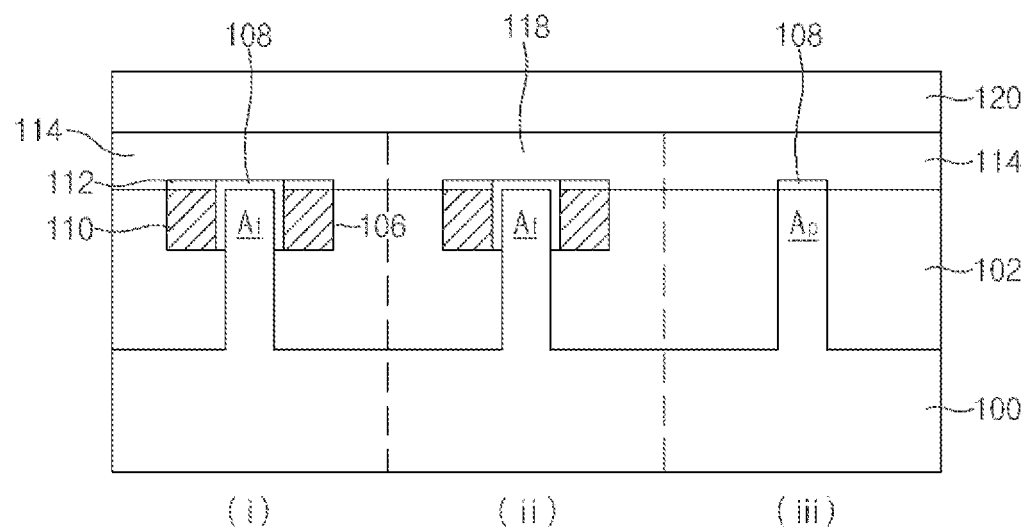
FIG. 1 is a cross-sectional view illustrating a semiconductor device according to an embodiment.

FIG. 1 is a cross-sectional view illustrating a semiconductor device according to an embodiment.

Referring to FIG. 1, the semiconductor device includes: a first active region ($A_f$) defined by a recess 106 contained in a device isolation film 102 of a semiconductor substrate 100 belonging to the first region (i) and the second region (ii), in a peripheral region including a first region (i), a second region (ii), and a third region (iii); a second active region ($A_p$) defined by the device isolation film 102 contained in the semiconductor substrate 100 of the third region (iii); a buried metal layer 110 buried in the recess 106; a first conductive layer 114 formed over the semiconductor substrate 100 of the first region (i); a second conductive layer 118 formed over the semiconductor substrate 100 of the second region (ii); and a first conductive layer 114 formed over the semiconductor substrate 100 of the third region (iii).

The first region (i) has a three-dimensional NMOS region, the second region (ii) includes a three-dimensional PMOS region, and the third region (iii) has a planar-type NMOS region or a planar-type PMOS region.

In addition, the first active region ($A_f$) includes a fin-type structure, and the second active region ($A_p$) includes a planar structure. Preferably, the recess 106 may be located at both sides of the first active region ($A_f$). Preferably, the buried metal layer 110 may include a titanium nitride (TiN) film, and may be one and a half times greater in thickness than a width of the recess 106, such that it is completely buried in the recess 106.

The first conductive layer 114 includes n-type polysilicon, and the second conductive layer 118 includes p-type polysilicon. Although the first conductive layer 114 is formed in the third region (iii) for convenience of description and better understanding of the embodiments, embodiments are not limited thereto, and it should be noted that the second conductive layer 118, instead of the first conductive layer 114, may also be formed in the third region (iii).

An insulation film is formed over the first active region ($A_f$) and the second active region ($A_p$). A silicide film 112 is formed over the buried metal layer 110. Preferably, a metal layer 120 may be formed over the first conductive layer 114 and the second conductive layer 118, and the metal layer 1120 may include tungsten (W).

As described above, according to the semiconductor device of the embodiment, the metal layer is buried in a recess configured to define a three-dimensional (3D) structure in the peripheral region. The n-type polysilicon and the p-type polysilicon are formed over the metal layer. The three-dimensional NMOS and PMOS transistors are formed in the peripheral region such that transistor performance can be improved.

A method for forming the above-mentioned semiconductor device according to the embodiment will hereinafter be described with reference to the FIGS. 2a to 2f.

Figure 2A:
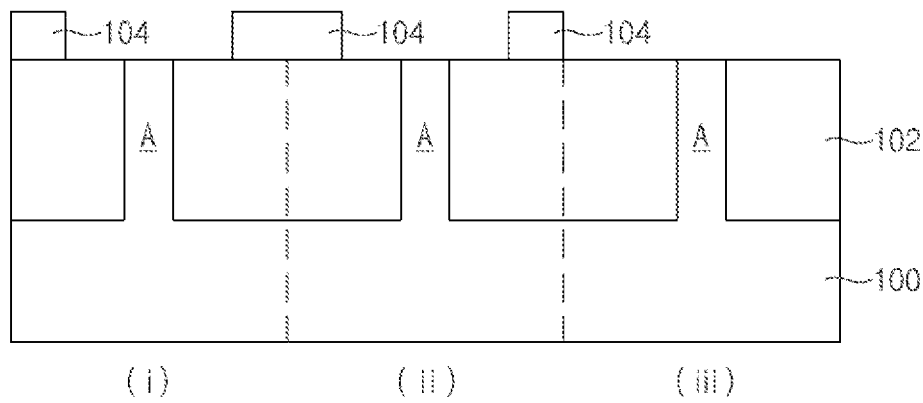
FIGS. 2a to 2f are cross-sectional views illustrating a method for forming a semiconductor device according to an embodiment.

Referring to FIG. 2a, a device isolation film 102 is formed in the semiconductor substrate 100 including the first region (i), the second region (ii), and the third region (iii). Preferably, the device isolation film 102 may be formed by a shallow trench isolation (STI) process. For example, an insulation film including either an oxide film or a nitride film fills a specific-depth trench formed in the semiconductor substrate. In this case, the first region (i) may include a three-dimensional NMOS region, the second region (ii) may have a three-dimensional PMOS region, and the third region (iii) may have a planar NMOS region or a planar PMOS region.

Subsequently, a mask pattern 104 is formed over the device isolation film 102. In this case, the mask pattern 104 is used as an etch mask for enabling the active region (A) defined by the device isolation film 102 to be protruded in the form of a fin. Therefore, the mask pattern 104 is formed only at a specific location in which the fin-type active region A will be defined. The mask pattern 104 is not formed over the device isolation film 102 in the planar-type active region (iii). In contrast, the mask pattern 104 may be formed in a manner that both sides of the active region A can be exposed.

Figure 2B:
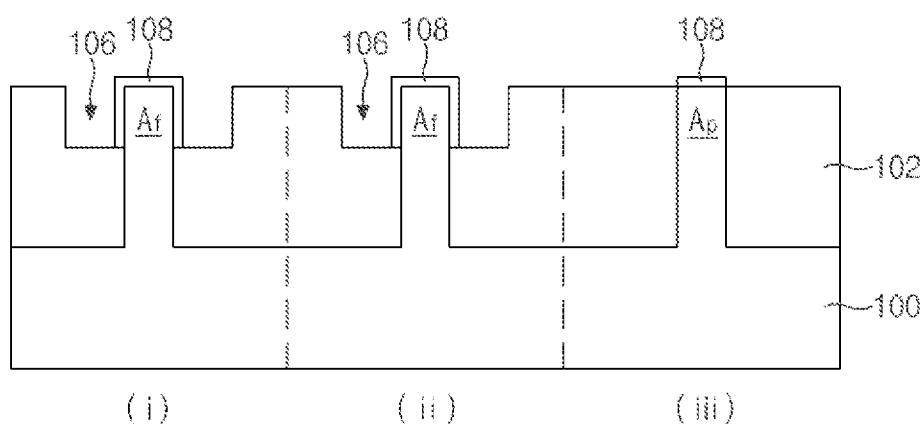

Referring to FIG. 2b, the device isolation film 102 is etched using the mask pattern 104 as an etch mask, resulting in formation of the recess 106. The recess 106 is formed in a manner that some parts of both sidewalls of the active region A are exposed. The fin-type active region ($A_f$) is defined by the recess 106. For convenience of description and better understanding of the embodiment, the active region is classified into a first active region ($A_f$) having a fin structure and a second active region ($A_p$) having a horizontal structure (or a planar structure).

Subsequently, a gate insulation film 108 is formed over the first active region ($A_f$) and the second active region ($A_p$). The gate insulation film 108 is formed over an upper surface of the first active region ($A_f$) and over a sidewall of the first active region ($A_f$) exposed by the recess 106. The gate insulation film 108 is also formed over an upper surface of the second active region ($A_p$). In this case, the gate insulation film 108 may be formed by Atomic Layer Deposition (ALD), Chemical Vapor Deposition (CVD), or a method of heating the semiconductor substrate in a furnace.

Figure 2C:
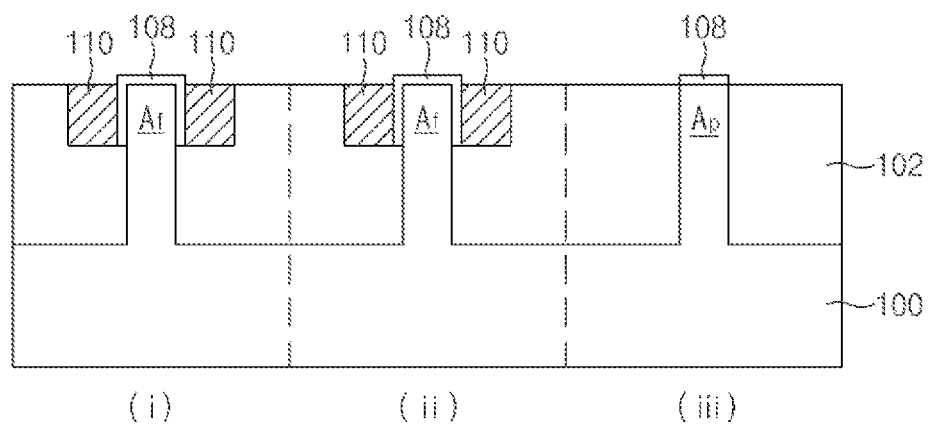

Referring to FIG. 2c, a metal layer is formed over the semiconductor substrate 100 including a trench (or recess) 106 (or recess) (See FIG. 2b). In this case, the metal layer may have a titanium nitride (TiN) material, and may be formed in a manner that the trench 106 is completely buried. For this purpose, the metal layer may have a thickness larger than a half of the width of the trench 106. Subsequently, the metal layer formed on the semiconductor substrate 100 is etched so that a buried metal layer 110 buried in the trench 106 is formed. The metal layer may be etched by adjusting an etch selectivity to prevent a gate insulation film from being etched. The buried metal layer 110 may be buried in the trench 106 in a manner that a process for separately depositing the n-type or p-type doped polysilicon over the trench (or recess) configured to define a three-dimensional (3D) structure is omitted from a total process for forming a three-dimensional (3D) NMOS or PMOS transistor in the peripheral region, such that a number of fabrication processes is reduced, resulting in reduction of production costs. In accordance with the semiconductor device according to the embodiment, the 3D NMOS or 3D PMOS transistor can be implemented in the peripheral region without causing defective products which may be generated when the n-type or p-type doped polysilicon is separately deposited over the trench (or recess) defining a three-dimensional (3D) structure.

For reference, the buried metal layer 110 formed in the first region (i) may have a work function higher than that of the first conductive layer formed over the buried metal layer 110 in a subsequent process. That is, the first conductive layer formed over the buried metal layer 110 may have a work function lower than that of the buried metal layer 110. Here, the first conductive layer may include n-type polysilicon. Therefore, the buried metal layer 110 may reduce an energy band gap between the first conductive layer and a source/drain region (not shown), such that a Gate Induced Drain Leakage (GIDL) can be reduced and prevent a threshold voltage from being changed.

In contrast, the buried metal layer 110 formed in the second region (ii) may have a work function lower than that of the second conductive layer formed over the buried metal layer 110 in a subsequent process. That is, the second conductive layer formed over the buried metal layer 110 may have a work function higher than that of the buried metal layer 110. Therefore, the buried metal layer 110 may have a work function that is higher than that of the first conductive layer and is lower than that of the second conductive layer. Here, the second conductive layer may include p-type polysilicon. As a result, the buried metal layer 110 may reduce an energy band gap between the second conductive layer and a source/drain region (not shown), such that a Gate Induced Drain Leakage (GIDL) can be reduced.

Figure 2D:
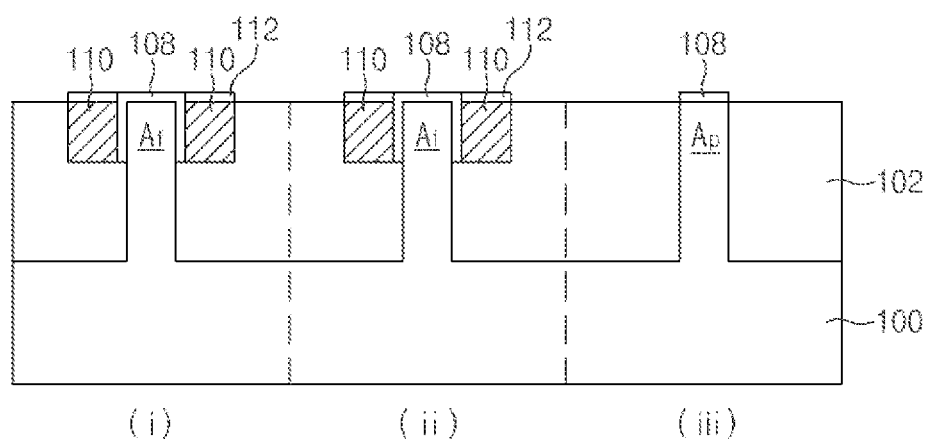

Referring to FIG. 2d, a silicide film 112 is formed over the buried metal layer 110. Preferably, the silicide film 112 may be formed only in the first and second regions (i) and (ii) including the buried metal layer 110. The silicide film 112 is formed so that interfacial resistance between the buried metal layer 110 and each of the first and second conductive layers to be formed in a subsequent process can be prevented from increasing.

For reference, the silicide film 112 may be formed by performing heat treatment on the buried metal layer 110. In more detail, the heat treatment may include a Rapid Thermal Annealing (RTA). The RTA may be carried out for about 10~60 seconds at a temperature of 400~600° C.

Figure 2E:
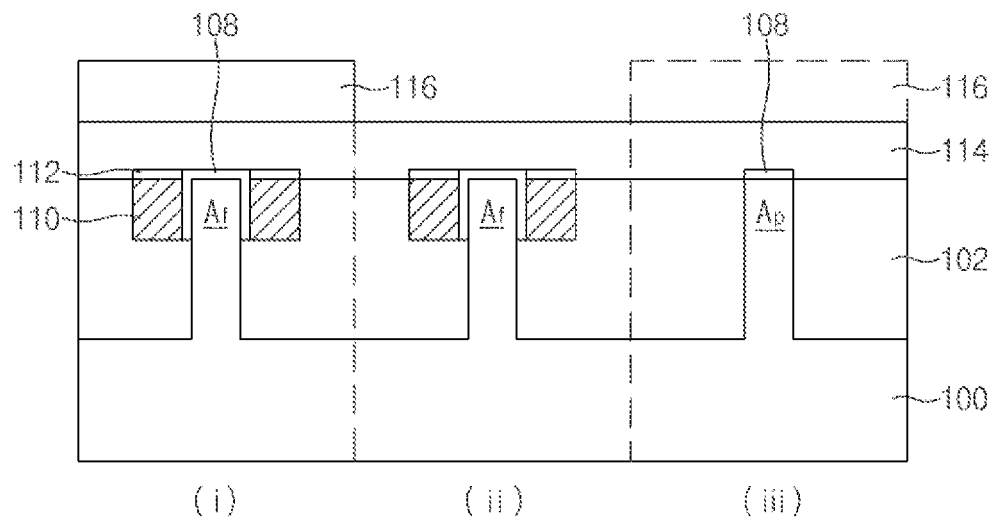

Referring to FIG. 2e, a first conductive layer 114 is formed over the semiconductor substrate 100. In this case, the first conductive layer 114 may have n-type polysilicon doped with n-type impurities. Preferably, the n-type impurity may include phosphorus (P) or arsenic (As).

Subsequently, a mask pattern 116 is formed over the first conductive layer 114. In this case, the mask pattern 116 may perform counter-doping of p-type impurities into the first conductive layer 114, and may be formed to cover the first region (i) while opening the second region (ii). In the case where a planar structure is defined as a PMOS region according to an embodiment, it is preferable that the mask pattern 116 is not formed in the third region (iii). In the case where a planar structure is defined as an NMOS region, it is preferable that the mask pattern 116 is formed in the third region (iii) as well. For convenience of description and better understanding of the embodiment, the mask pattern 116 is denoted by a dotted line. In accordance with the embodiment, the planar structure may be defined as the NMOS region.

Figure 2F:
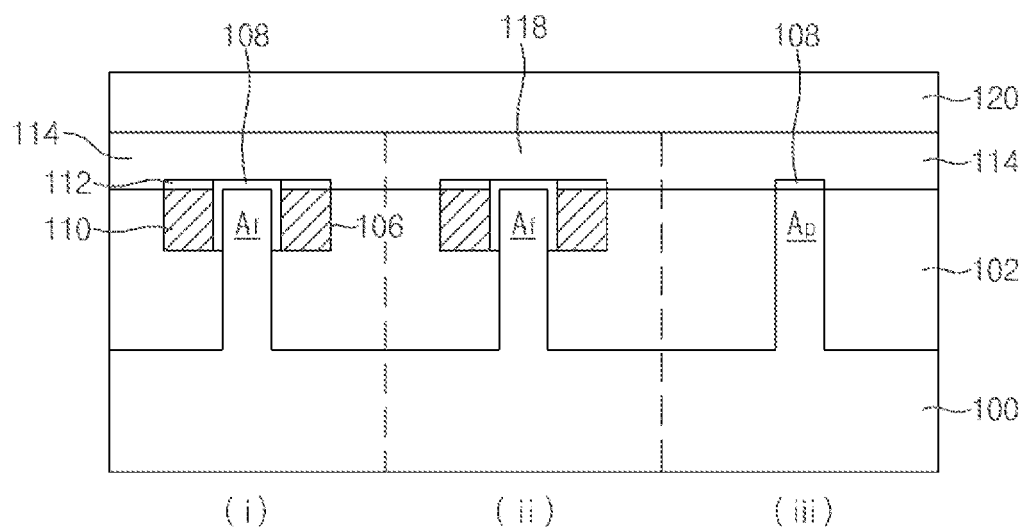

Referring to FIG. 2f, a metal layer 120 is formed over the first conductive layer 114. Preferably, the metal layer 120 may include tungsten (W). The metal layer 120 may be formed to reduce resistance of the gate.

As described above, in accordance with the semiconductor device and the method for forming the same according to the embodiments, after the fin-type active region defined by a recess formed by partial etching of the device isolation film is formed, the buried metal layer is formed to fill the recess, such that the three-dimensional (3D) NMOS transistor and the 3D PMOS transistor are formed in the peripheral region, resulting in maximum performance of the transistors.

As is apparent from the above description, a three-dimensional dual gate is formed in the peripheral region, such that performance or throughput of each transistor can be maximized even in the peripheral region.

Those skilled in the art will appreciate that embodiments may be carried out in other specific ways than those set forth herein without departing from the spirit and essential characteristics of the embodiments. The above exemplary embodiments are therefore to be construed in all aspects as illustrative and not restrictive. Embodiments should be determined by the appended claims and their legal equivalents, not by the above description, and all changes coming within the meaning and equivalency range of the appended claims are intended to be embraced therein.

The above embodiments are illustrative and not limitative. Various alternatives and equivalents are possible. The invention is not limited by the type of deposition, etching, polishing, and patterning steps described herein. Nor is the embodiment limited to any specific type of semiconductor device. For example, the embodiment may be implemented in a dynamic random access memory (DRAM) device or non volatile memory device. Other additions, subtractions, or modifications may be made.

What is claimed is:

1. A semiconductor device comprising:
   a peripheral region in a semiconductor substrate, the peripheral region including a first region, a second region, and a third region;
   first active regions formed in the first region and the second region, the first active regions defined by recesses provided in device isolation films of the first region and the second region;
   a second active region defined by the device isolation film and provided in the third region;
   a buried metal layer buried in one or more of the recesses;
   a first conductive layer of a first type formed over a first portion of the first active regions and a first portion of the buried metal layer in the first region; and
   a second conductive layer of a second type formed over a second portion of the first active regions and a second portion of the buried metal layer in the second region, wherein the first type is different from the second type,
   wherein one of the first conductive layer and the second conductive layer is further formed over the second active region in the third region, and
   wherein a top surface of the buried metal layer is substantially coplanar with top surfaces of the first active regions.

2. The semiconductor device according to claim 1, wherein the first region includes a three-dimensional (3D) NMOS region.

3. The semiconductor device according to claim 1, wherein the second region includes a three-dimensional (3D) PMOS region.

4. The semiconductor device according to claim 1, wherein the third region includes a planar NMOS region or a planar PMOS region.

5. The semiconductor device according to claim 1, wherein the first active regions include fin-type structures.

6. The semiconductor device according to claim 1, wherein the second active region includes a planar structure.

7. The semiconductor device according to claim 1, wherein the recesses are formed at both sides of the first active regions.

8. The semiconductor device according to claim 1, wherein the buried metal layer includes a titanium nitride (TiN) film.

9. The semiconductor device according to claim 1, wherein the buried metal layer has a thickness larger than about a half of a recess width, and wherein the width is measured in a direction of a shortest distance between the first active regions and second active region, and the thickness is measured in a direction perpendicular to the width.

10. The semiconductor device according to claim 1, wherein the first conductive layer in the first region includes n-type polysilicon.

11. The semiconductor device according to claim 1, wherein the second conductive layer includes p-type polysilicon.

12. The semiconductor device according to claim 1, further comprising:
    a first insulation film formed over a surface of the first portion or the second portion of the first active regions and over a sidewall of the first portion or the second portion of the first active regions; and
    a second insulation film formed over a surface of the second active region.

13. The semiconductor device according to claim 1, further comprising:
    a silicide film formed over the first portion or the second portion of the buried metal layer.

14. The semiconductor device according to claim 1, further comprising:
    a metal layer formed over (i) the first conductive layer, (ii) the second conductive layer, or (iii) both.

15. The semiconductor device according to claim 14, wherein the metal layer includes tungsten (W).

16. A semiconductor device comprising:
    a peripheral region including a first region, a second region, and a third region;
    a first three-dimensional active region provided in the first region and the second region;
    a second two-dimensional active region provided in the third region;
    a first gate including a first conductive layer of a first type in the first region and a second conductive layer of a second type in the second region, the first gate provided over and coupled to the first three-dimensional active region, wherein the first type is different from the second type; and
    a buried metal layer provided over a sidewall of the first three-dimensional active region and coupled to the first gate,
    wherein the buried metal layer has a first work function, and the first gate has a second work function different from the first work function, and
    wherein a top surface of the buried metal layer is substantially coplanar with top surfaces of the first three-dimensional active region.

17. The semiconductor device of claim 16,
    wherein the first three-dimensional active region includes a first polarity active region and a second polarity active region,
    wherein the second polarity is different from the first polarity, and
    wherein the first work function is higher than the second work function in the first polarity active region, and the first work function is lower than the second work function in the second polarity active region.

18. The semiconductor device of claim 17,
    wherein the first gate in the first polarity active region forms a fin-type NMOS transistor,
    wherein the first gate in the second polarity active region forms a fin-type PMOS transistor, and
    wherein a gate in the second two-dimensional active region forms one of a planar NMOS transistor and a planar PMOS transistor.

19. The semiconductor device of claim 16, wherein the first conductive layer includes n-type polysilicon.

20. The semiconductor device of claim 16, wherein the second conductive layer includes p-type polysilicon.

\* \* \* \* \*